United States Patent [19]
Hundt et al.

[11] Patent Number: 5,610,800
[45] Date of Patent: Mar. 11, 1997

[54] SUBSTRATE MOUNTING OF CIRCUIT COMPONENTS WITH A LOW PROFILE

[75] Inventors: Michael J. Hundt, Double Oak; Harry M. Siegel, Hurst, both of Tex.

[73] Assignee: SGS-THOMSON Microelectronics, Inc., Carrollton, Tex.

[21] Appl. No.: 553,087

[22] Filed: Nov. 3, 1995

Related U.S. Application Data

[63] Continuation of Ser. No. 299,200, Aug. 31, 1994, abandoned.

[51] Int. Cl.⁶ .................. H05K 1/18; H01R 9/00
[52] U.S. Cl. ............ 361/761; 361/760; 361/772; 361/774; 257/784; 29/832
[58] Field of Search ............... 361/760–764, 361/774, 807, 809, 772; 257/723–724, 784, 924; 174/260; 29/827, 832, 843

[56] References Cited

U.S. PATENT DOCUMENTS

| | | |
|---|---|---|
| 3,480,836 | 11/1969 | Aronstein . |
| 4,511,796 | 4/1985 | Aigo . |
| 4,653,822 | 3/1987 | Kanazawa . |
| 4,763,308 | 8/1988 | Morata . |
| 4,992,987 | 2/1991 | Echols et al. ............ 365/229 |
| 4,998,888 | 3/1991 | Link et al. ............... 439/73 |
| 4,999,740 | 3/1991 | Ilardi et al. . |
| 5,187,564 | 2/1993 | McCain . |
| 5,289,034 | 2/1994 | Hundt .................... 257/678 |
| 5,294,829 | 3/1994 | Hundt et al. ............ 257/678 |
| 5,386,343 | 1/1995 | Pao ........................ 361/761 |

OTHER PUBLICATIONS

Ser. No. 07/995,665 filed Dec. 21, 1992 by Dixon et al.
Ser. No. 08/225/227 filed Apr. 8, 1994 by Siegel et al.

Primary Examiner—Bot L. Ledynh
Attorney, Agent, or Firm—Theodore E. Galanthay; Lisa K. Jorgenson

[57] ABSTRACT

A system for packaging circuit components is disclosed. The system includes a substrate having a plurality of openings to accommodate mounting various circuit components and the circuit components mounted therein. The substrate has first, second, third and fourth contacts providing mechanical and electrical connection to the various components. An opening is provided for accommodating a first auxiliary component such as a battery wherein the battery terminals attach to the first and second contacts. Another opening is provided in the substrate to accommodate a second auxiliary component such as a crystal resonator having leads which attach to the third and fourth contacts. The substrate preferably has another opening for accommodating an integrated circuit chip package, the chip package having conventional leads for mounting to a circuit board and terminals for connecting to the substrate contacts. Lockout tabs are also preferably provide on the substrate and chip package to ensure proper mounting of the chip package to the substrate and proper electrical connection of the chip package to the components on the substrate.

18 Claims, 2 Drawing Sheets

SUBSTRATE MOUNTING OF CIRCUIT COMPONENTS WITH A LOW PROFILE

This is a continuation of application Ser. No. 08/299,200 filed Aug. 31, 1994 now abandoned.

FIELD OF THE INVENTION

The present invention is in the field of integrated circuits, and is more particularly directed to mounting of various circuit components and an integrated circuit chip package on a substrate.

BACKGROUND OF THE INVENTION

In the field of electronic system manufacturing, packaging technology has been and will continue to be an important factor to achieve more reliable and less costly packages for denser packaging applications. One of the most common packaging techniques provides for the leads of integrated circuit packages to be soldered into holes in the printed circuit boards, called through-hole packaging. However, the use of surface mount technology to attach and connect integrated circuit components onto printed circuit boards has continued to grow. Surface mount technology is used more widely today in the areas of personal computers, communications and automotive market segments. As is known in the art, surface mountable integrated circuit packages have leads which are folded or bent to allow for their solder connection to a planar surface of a circuit board, eliminating the need for plated-through holes through the circuit board. Surface mount packages can be mounted on both sides of a printed circuit board whereas the through-hole packages can only be mounted on one side, thus significantly reducing the size of the system and increasing the component density of the circuit board. Other advantages of surface mount packages include enhanced electrical performance with the shorter lead lengths and mounting flexibility such as with the gull wing style or the 'J' leads, for example, with a small outline integrated circuit package (SOIC) or plastic leaded chip carrier (PLCC). Since the assembled surface mount boards are generally smaller, multilayer printed circuit boards can be used without significantly increasing board cost.

The surface mountable integrated circuit is, however, subjected to greater thermal and mechanical stress during the assembly procedure than are integrated circuits of the dual-in-line (DIP) and similar package types. The mounting of a dual-in-line integrated circuit package to the circuit board is accomplished by wave solder of the underside of the circuit board (i.e., the side opposite that of the integrated circuit), as the pins of the integrated circuit package extend through the plated through-holes in the circuit board. Accordingly, the circuit board itself insulates the integrated circuit package body from the high solder temperatures and harsh chemicals to which the integrated circuit package body is located. However, in the surface mount integrated circuit package body and its contents are directly subjected to the high temperature of the flowing solder, and to harsh chemicals used in the soldering process, such as flux, solder, and cleaning solvents. Conventional surface-mountable integrated circuits that contain only a semiconductor device and its wire connections are generally able to withstand the thermal, chemical and mechanical stresses presented by the surface mount process. As such, the use of surface mount techniques in the manufacture of circuit boards of many types has become widespread, obtaining the density advantages provided by this technology.

Electronic devices which comprise integrated circuit components are usually powered by an external electric supply. It is increasingly more common and desirable to provide electronic components with a back-up power supply to assure retention of stored information in the event of a power loss from the primary supply. In recent years, the use of battery power for many electronic circuit functions has become available, primarily due to advances made in complementary metal-oxide-semiconductor (CMOS) fabrication and design technology. As is well known, CMOS integrated circuits are able to operate with extremely low active power requirements; in the case of CMOS memory devices, such as static random access memories (SRAMs), the power requirements allow operation and data retention in electronic systems to be powered by conventional lithium batteries and other cell types, improving the portability and reliability of modern electronic systems. By way of background, co-pending U.S. patent application Ser. No. 07/995,665, filed Dec. 21, 1992 and entitled "Surface Mountable Integrated Circuit Package with Integrated Battery Mount", assigned to SGS-Thomson Microelectronics, Inc. and incorporated herein by this reference, describes an example of packages containing both a semiconductor integrated circuit and a battery.

Conventional batteries, however, are unable to reliably withstand the temperatures and chemical conditions to which an integrated circuit is subjected during the assembly process. For example, some types of batteries can be irreparably damaged by exposure to temperatures as low as 181° C., which is below the temperature of certain solders used in the mounting process. Other components, such as quartz crystal resonators used in connection with on-chip oscillators, are also vulnerable to these harsh environmental conditions. The harsh chemical environment of the mounting process can also damage the physical construction of these components. By way of further background, copending U.S. patent application Ser. No. 08/225,227, filed Apr. 8, 1993 and entitled "Surface Mountable Integrated Circuit Package with Low-Profile Detachable Module", assigned to SGS-Thomson Microelectronics, Inc. and incorporated herein by this reference, describes an example of a surface mountable chip package and a module containing temperature-sensitive components such as a battery.

Certain system applications install circuit boards with close spacing relative to one another. As a result, the height of components when installed on the circuit board must be kept very low.

It is therefore an object of the present invention to provide a substrate adapted to receive an integrated circuit package and other circuit components such as a battery and an oscillator.

It is a further object of the present invention to provide such a substrate incorporating such components in a low cost and low-profile package.

It is further object of the present invention to provide such a substrate whereby the circuit components can be mounted onto the substrate which is then mounted to the integrated circuit package attached to a circuit board thereby minimizing the need to expose the circuit components to harsh environments during the assembly of the integrated circuit package to the circuit board.

Other objects and advantages will be apparent to those of ordinary skill in the art having reference to this specification in combination with the drawings.

SUMMARY OF THE INVENTION

The invention may be implemented into a substrate containing various integrated circuit components, including an integrated circuit chip package and temperature sensitive components such as a battery and crystal resonator. The molded chip package has conventional leads for power and signal connections to a circuit board, and further includes terminals for connections to the substrate. The substrate has a cutout for accommodating the chip package and has contacts that mate with the chip package terminals. The substrate further has additional cutouts for accommodating auxiliary circuit components. The same substrate contacts used for the chip package are used for attachment by leads of the other components to provide mechanical support and electrical connection to the chip package. The substrate and chip package also preferably have lockout features to prevent misorientation of the chip package relative to the substrate contacts and the auxiliary components during assembly. The auxiliary components and the chip package, each supported within the substrate, provide a low cost, low profile package.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

Figure 1:
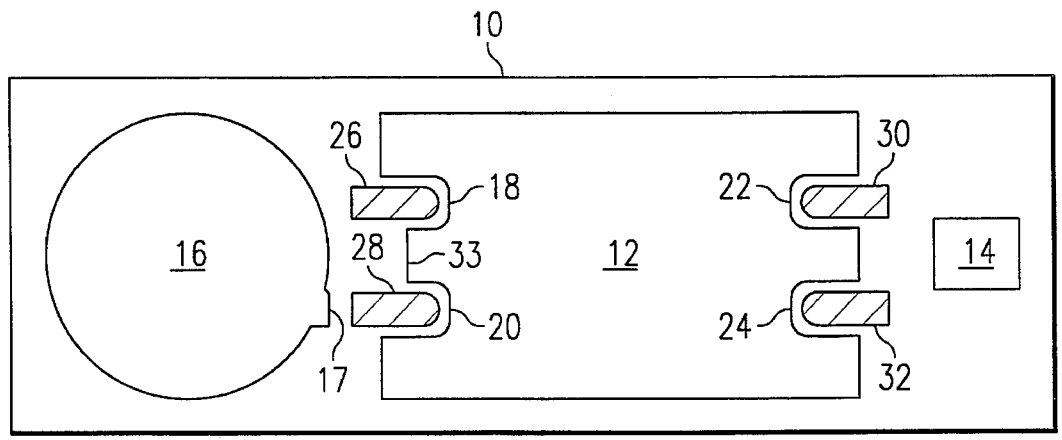
FIG. 1 is a plan view of a substrate suitable for mounting temperature sensitive components according to the preferred embodiment of the present invention.

Referring to FIG. 1, a preferred embodiment of the present invention will now be described in detail. Substrate 10 is designed to support integrated circuit components. Various cutouts or openings 12, 14 and 16 are formed in the substrate to accommodate the circuit components. The size and shape of each opening will be determined by the orientation and type of each component to be mounted in the opening. Opening 12 is formed in substrate 10 to support the mounting of an integrated circuit chip package as more fully described below. Opening 14 is formed in the substrate and will be of sufficient size and orientation to accommodate a circuit component such as a crystal resonator. Opening 14 could thus, for example, be rectangular in shape and be formed to have the longer sides of the rectangle either parallel or perpendicular to the edge of the substrate. Opening 16 will be formed to a sufficient size and shape to accommodate another circuit component such as an electrochemical cell.

Opening 12 will have various contacts or lands to provide both a mechanical and electrical connection to the various components which need to be connected together. The mechanical connection will provide necessary physical support for the components. In a particular embodiment, tabs 18, 20, 22 and 24 are support tabs for the electrical connectors which will provide the physical support and electrical connection for the components. Tabs 18–24 are part of the substrate and project into opening 12. As known in the art, conductive contacts 26, 28, 30 and 32 will be formed on tabs 18–24, respectively to provide electrical conduction to both sides of substrate 10. For example, conventional printed circuit board traces may be used as conductive contacts, or metallized vias may be formed through the substrate to make electrical connection to the contacts to be formed on each side of tabs on the substrate. The electrical contacts may be formed by way of solder or other conventional method. The tabs and contacts will provide for both mechanical and electrical connection for both sides of the substrate as more fully described below. A lockout tab 33 is formed projecting inwardly toward the cutout or opening 12. Lockout tab 33 will force any component positioned in cutout 12 to be aligned properly for correct electrical connection to contacts 26–32.

Figure 2:
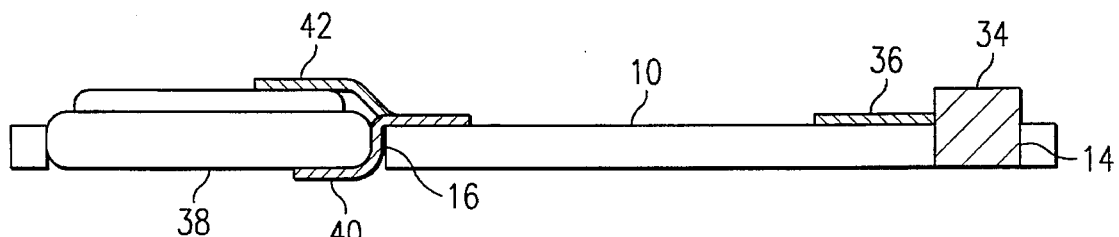
FIG. 2 is an elevation view of the substrate and components according to the preferred embodiment of the present invention.

Referring to FIG. 2, the installation of the components to substrate 10 will now be described. FIG. 2 illustrates, in plan view, crystal resonator 34 installed within the rectangular cutout 14. Crystal resonator 34 is preferably of the conventional quartz type, hermetically sealed in a metal package with two wires 36 extending from one end. The crystal resonator may set the frequency of an oscillator circuit in a semiconductor device within an integrated circuit chip package positioned in cutout or opening 12. Crystal resonator 34 is positioned into substrate 10 by placing it into the cutout defined by opening 14, and by fastening wires 36 to contacts 30, 32 (shown in FIG. 1) on the top side of the tabs substrate 10 by conventional techniques such as ultrasonic or thermocompression bonding, or spot welding. The lower surface of crystal resonator 34 may be flush or substantially planar with the lower surface of substrate 10. Again, crystal resonator 34 may be oriented in any desired positioned by changing the orientation of opening or cutout 14.

Electrochemical cell for integrated circuit chip back-up power supply 38, with pre-attached tab leads 40, 42 may be installed in opening 16. Examples of integrated circuits that may use both a crystal oscillator and a cell include timekeeper circuits, and clocked logic devices based on a steady clock frequency input. Tab leads 40, 42 are preferably prewelded to the positive and negative terminal sides of cell 38, respectively, for ease of manufacture. Tab lead 40 is then fastened to contact 28 (shown in FIG. 1), and tab lead 42 is fastened to contact 26, each by way of welding or another conventional technique. As in the case of the crystal resonator 34, both of the tab leads of the cell 38 are fastened to the contacts on the top side of the substrate 10, which will allow for connection to the contacts by another component on the under side of the substrate. Electrochemical cell 38 is preferably of the lithium type, due to its high energy density. In a particular arrangement, cell 38 is of the disk shape, with opposing sides of the body of the disk serving as positive and negative terminals, and is physically supported by the attachment of the tab leads 40, 42 to the contacts 26, 28. respectively. As with the crystal resonator 34, cell 38 will be positioned such that the lower surface of cell 38 may be flush or substantially planar with the lower surface of substrate 10. Notch 17 shown in FIG. 1 will provide space for tab lead 40 to reach the upper side of substrate 10 to connect to contact 28.

Figure 3:
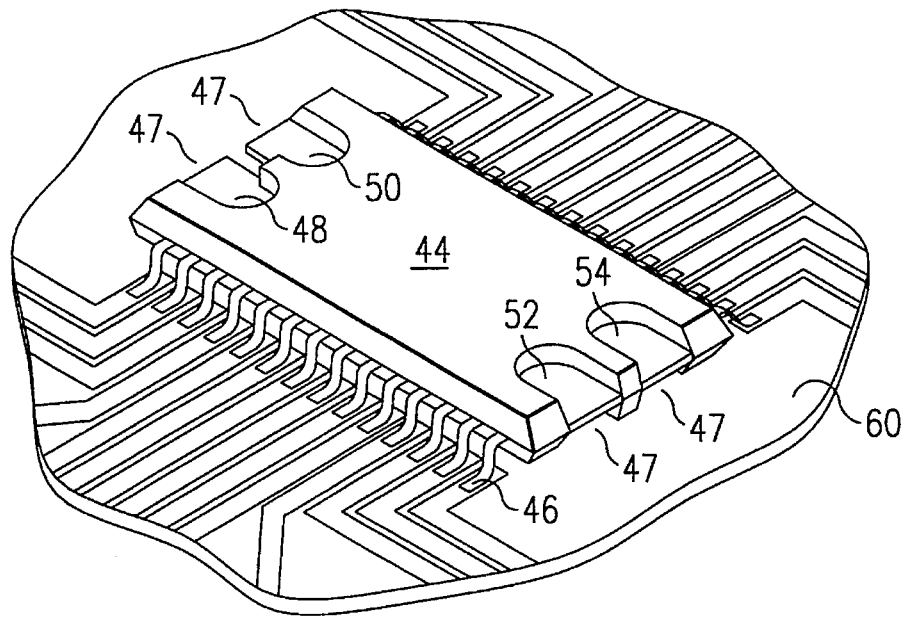
FIG. 3 is a view of a chip package and circuit board according to the preferred embodiment of the present invention.

Referring to FIG. 3, integrated circuit chip package 44 of the present invention is a molded package having leads 46 which are fashioned so as to be mountable to printed circuit board 60, in the well known manner. Leads 46 may be formed for surface mounting to printed circuit board 60 such as a standard gull-wing style SOIC package, or may be the well-known J-lead configuration. Alternatively, the chip package may be a known through-hole package such as a dual-in-line (DIP) package. Chip package 44 is preferably a molded plastic type to achieve low cost and for ease of manufacture. However, it is also contemplated that the present invention is applicable to systems where the chip package is of the ceramic hermetically sealed type. Of course, a semiconductor integrated circuit device (not shown) is mounted within chip package 44, and electrical connection is made between leads 46 and bond pads on the integrated circuit device by way of wires, beams or other conventional conductive members.

Chip package 44 includes four sculpted cutouts 47 from its body, with two cutouts located at each end of the package. In order to maintain a minimal footprint for the package when attached to the substrate, cutouts 47 are formed into the rectangular body of the chip package 44. It is contemplated that this placement of cutouts will not generally impact the placement of the semiconductor device within package 44, considering that package 44 is much longer than it is wide and that the integrated circuit chip mounted within package 44 will seldom extend fully to the ends of package 44.

Figure 4:
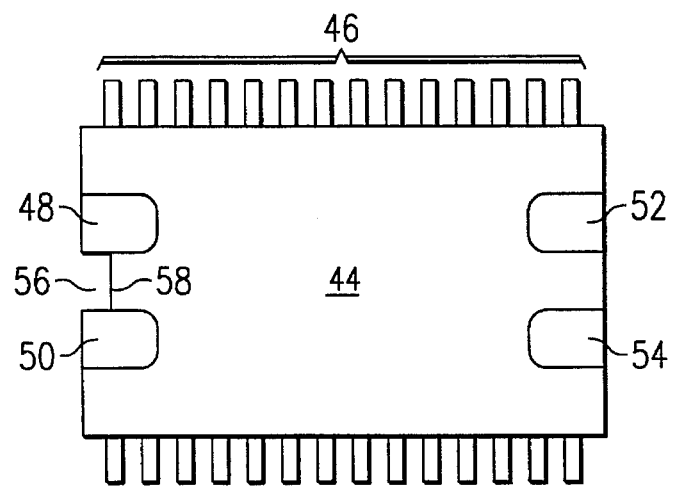
FIG. 4 is a plan view of a chip package according to the preferred embodiment of the present invention.

Referring to FIG. 4, a plan view of chip package 44 is shown. Wires (not shown) electrically connect leads 46 to corresponding terminals on the semiconductor device (not shown) packaged within chip package 44. Conductive tabs or terminal plates 48, 50, 52 and 54 extend from the lead frame of chip package 44 into the cutouts 47, with tabs 48 and 50 on one end of the package and tabs 52 and 54 on the other end of the package (also shown in FIG. 3). Conductive tabs 48–52 are preferably an extension of the lead frame within package 44.

Substrate 10, including an electrochemical cell and a crystal oscillator as described above, has contacts 26–32 with a bottom surface location corresponding to an upper surface of the chip package conductive tabs 48–54, respectively, extending from the lead frame. The contacts 26–32 of the substrate are then mated with the conductive tabs 48–54 of the chip package to form a physical and electrical connection by way of welding or other conventional technique. Lockout tab 33 on the substrate will extend between conductive tabs 48 and 50 at location 56. Chip package 44 accommodates the lockout tab 33 with a recessed region 58 in the chip package. The lockout tab 33, extending between only two of the conductive tabs 48, 50, ensures proper electrical connection between the electrochemical cell 38 and the crystal resonator 34, on the one hand, and the appropriate terminals of the integrated circuit within chip package 44, on the other hand. Misorientation of the chip package 44, and the possibility of severe electrical damage, is thus prevented.

It is contemplated that, in the usual manufacture of a substrate housing the system of the present invention, chip package 44 will first be mounted to circuit board 60 by wave solder, or another conventional method. Substrate 10 and its contents may then be mounted to the chip package 44 by mating the contacts 26–32 in opening 12 to the conductive tabs 48–54 of chip package 44. Although the mounting of substrate 10 to chip package 44 may be accomplished before the chip package is mounted to circuit board 60, there are advantages to the reverse order in the process. The process of mounting chip package 44 to circuit board 60, particularly if the chip package is of the surface mount type, may create an extreme environment of high temperatures with harsh chemicals. By mounting substrate 10 to chip package 44 after the chip package has been mounted to circuit board 60 will minimize exposure of the components attached to the substrate, such as the cell and crystal resonator, to any solder, flux, solvents and temperature extremes to which the chip package 44 may be subjected. Thus, the reliability of other environmentally sensitive circuit components attached to the substrate will be maintained.

Substrate 10 may be removed from chip package 44 at tab locations 48–54 without removing the chip package from circuit board 60 to which leads 46 are attached. In the case where the substrate 10 includes a cell or battery 38, the ability to remove the substrate 10 from the chip package facilitates replacement of the battery upon the end of its useful life. Further, in this configuration, cell 38 and crystal resonator 34 do not overlie the chip package 44, but instead are disposed to the sides of chip package 44. The overall height of the system is minimized. In addition, since the tabs 48–54 of chip package 44 extend into the cutouts 47 from the lead frame, when the chip package 44 is mounted to contacts 26–32 on the substrate, a portion of the chip package will extend upward through opening 12 and lie above the surface of the substrate 10. Sufficient clearance will exist for mounting the leads 46 to circuit board 60 underlying the package 44, however, the overall height of chip package 44 lying below substrate 10 will also be minimized.

We claim:

1. A system for packaging circuit components, comprising:
   a substrate comprising:
      a plurality of openings;
      first and second contacts extending inwardly from a first side of a first opening and third and fourth contacts extending inwardly from a second side of the first opening;
   a first auxiliary component positioned in a second opening in the substrate having first and second terminals mating with the first and second contacts, wherein a lower surface of the first auxiliary component is substantially planar with a lower surface of the substrate; and
   a second auxiliary component positioned in a third opening in the substrate having third and fourth terminals mating with the third and fourth contacts of the second side of the first opening, wherein a lower surface of the second auxiliary component is substantially planar with the lower surface of the substrate.

2. The system of claim 1, wherein the first auxiliary component comprises a battery, electrically connected to the first and second contacts.

3. The system of claim 1, wherein the second auxiliary component comprises a crystal resonator, electrically connected to the third and fourth contacts.

4. The system of claim 1, further comprising solder on a surface of each contact for facilitating electrical connection to the first and second auxiliary components.

5. The system of claim 1, further comprising:
   a chip package positioned in the first opening of the substrate, comprising:
      a body containing a semiconductor device;
      a plurality of leads extending from the body, said leads in electrical connection therefrom, and of the type suitable for mounting to a circuit board; and first and second terminal plates on a first end of the body and third and fourth terminal plates on a second end of the body extending from the body, wherein the first and second terminal plates mate with the first and second contacts, and wherein the third and fourth terminal plates mate with the third and fourth contacts.

6. The system of claim 5, wherein the first opening of the substrate comprises a lockout tab extending inwardly between the first and second contacts; and wherein the body of the chip package comprises a recess between the first and second terminal plates such that when the chip package is mated with the substrate the lockout tab of the substrate extends into the recess in the chip package to insure proper alignment of the chip package to the substrate.

7. The system of claim 5, wherein the body of the chip package comprises molded plastic.

8. The system of claim 5, wherein the chip package comprises an SOIC package.

9. The system of claim 5, wherein the chip package comprises a PLCC package.

10. The system of claim 5, wherein the chip package comprises a DIP package.

11. A plurality of components adapted to be mounted to a substrate, comprising:

a first auxiliary component positioned in a first opening in the substrate having first and second terminals mating with a first and a second contact on the substrate, wherein a lower surface of the first auxiliary component is substantially planar with a lower surface of the substrate; and a second auxiliary component positioned in a second opening in the substrate having third and fourth terminals mating with a third and a fourth contact on the substrate, wherein a lower surface of the second auxiliary component is substantially planar with the lower surface of the substrate, and wherein the substrate and auxiliary components have a maximum height above the surface of the substrate suitable for mounting in spaces requiring a low profile.

12. The components of claim 11, wherein the first auxiliary component comprises a battery, electrically connected to the first and second contacts.

13. The components of claim 11, wherein the second auxiliary component comprises a crystal resonator, electrically connected to the third and fourth contacts.

14. The components of claim 11, further comprising:

a chip package positioned in a third opening of the substrate, comprising:

a body containing a semiconductor device;

a plurality of leads extending from the body, the leads in electrical connection therefrom, and of the type suitable for mounting to a circuit board; and first and second terminal plates on a first end of the body and third and fourth terminal plates on a second end of the body extending from the body, wherein the first and second terminals mate with the first and second contacts, and wherein the third and fourth terminal plates mate with the third and fourth contacts.

15. The components of claim 14, wherein the third opening of the substrate comprises a lockout tab extending inwardly from between the first and second contacts; and wherein the body of the chip package comprises a recess between the first and second terminal plates such that when the chip package is mated with the substrate the lockout tab of the substrate extends into the recess in the chip package to insure proper alignment of the chip package to the substrate.

16. A method of forming a circuit component package, comprising the steps of:

attaching an integrated circuit chip package to a circuit board;

attaching a first and a second terminal of a first auxiliary component to a first and a second contact of a substrate; wherein a lower surface of the first auxiliary component is substantially planar with a lower surface of the substrate;

attaching a first and a second terminal of a second auxiliary component to a third and a fourth contact of the substrate; wherein a lower surface of the second auxiliary component is substantially planar with the lower surface of the substrate; and attaching the substrate to the chip package; wherein the chip package has first and second terminal plates on a first end of the package and third and fourth terminal plates on a second end of the package wherein the first and second terminal plates are mated to the first and second contacts of the substrate and the third and fourth terminal plates are mated to the third and fourth contacts of the substrate.

17. A plurality of components adapted to be mounted to a substrate, comprising:

a first auxiliary component positioned in a first opening in the substrate having first and second terminals mating with a first and a second contact on the substrate, wherein a lower surface of the first auxiliary component is substantially planar with a lower surface of the substrate;

a second auxiliary component positioned in a second opening in the substrate having third and fourth terminals mating with a third and a fourth contact on the substrate, wherein a lower surface of the second auxiliary component is substantially planar with the lower surface of the substrate, and wherein the substrate and auxiliary components have a maximum height suitable for mounting in spaces requiring a low profile; and a chip package positioned in a third opening of the substrate, comprising:

a body containing a semiconductor device;

a plurality of leads extending from the body, the leads in electrical connection therefrom, and of the type suitable for mounting to a circuit board; and first and second terminal plates on a first end of the body and third and fourth terminal plates on a second end of the body extending from the body, wherein the first and second terminals mate with the first and second contacts, and wherein the third and fourth terminal plates mate with the third and fourth contacts.

18. A plurality of components adapted to be mounted to a substrate, comprising:

a first auxiliary component positioned in a first opening in the substrate having first and second terminals mating with a first and a second contact on the substrate, wherein a lower surface of the first auxiliary component is substantially planar with a lower surface of the substrate;

a second auxiliary component positioned in a second opening in the substrate having third and fourth terminals mating with a third and a fourth contact on the substrate, wherein a lower surface of the second auxiliary component is substantially planar with the lower surface of the substrate, and wherein the substrate and auxiliary components have a maximum height suitable for mounting in spaces requiring a low profile; and a chip package positioned in a third opening of the substrate, comprising:

a body containing a semiconductor device;

a plurality of leads extending from the body, the leads in electrical connection therefrom, and of the type suitable for mounting to a circuit board;

first and second terminal plates on a first end of the body and third and fourth terminal plates on a second end of the body extending from the body, wherein the first and second terminals mate with the first and second contacts, and wherein the third and fourth terminal plates mate with the third and fourth contacts, and wherein the third opening of the substrate comprises a lockout tab extending inwardly from between the first and second contacts; and wherein the body of the chip package comprises a recess between the first and second terminal plates such that when the chip package is mated with the substrate the lockout tab of the substrate extends into the recess in the chip package to insure proper alignment of the chip package to the substrate.

* * * * *